United States Patent
Ko

(10) Patent No.: US 7,362,253 B2
(45) Date of Patent: Apr. 22, 2008

(54) INTRODUCTION TO R2RC D/A CONVERTER

(75) Inventor: Terasuth Ko, Hong Kong (CN)

(73) Assignee: Supertex, Inc., Sunnyvale, CA (US)

( * ) Notice: Subject to any disclaimer, the term of this patent is extended or adjusted under 35 U.S.C. 154(b) by 0 days.

(21) Appl. No.: 11/530,702

(22) Filed: Sep. 11, 2006

(65) Prior Publication Data
US 2007/0069935 A1    Mar. 29, 2007

Related U.S. Application Data

(60) Provisional application No. 60/720,551, filed on Sep. 26, 2005.

(51) Int. Cl.
*H03M 1/66* (2006.01)
(52) U.S. Cl. .................... 341/144; 341/154; 341/172
(58) Field of Classification Search ................ 341/144, 341/154, 145, 120, 172; 375/252
See application file for complete search history.

(56) References Cited

U.S. PATENT DOCUMENTS

| | | | | |
|---|---|---|---|---|
| 5,841,382 | A * | 11/1998 | Walden et al. | 341/120 |
| 6,067,036 | A * | 5/2000 | Mauthe et al. | 341/143 |
| 6,304,608 | B1 * | 10/2001 | Chen et al. | 375/252 |
| 6,469,647 | B1 * | 10/2002 | Kinugasa et al. | 341/145 |

* cited by examiner

*Primary Examiner*—Jean B Jeanglaude
(74) *Attorney, Agent, or Firm*—Jeffrey D. Moy; Weiss & Moy, P.C.

(57) ABSTRACT

A Digital to Analog (D/A) converter has a plurality of stages. Each of the plurality of stages has a first resistive element. A second resistive element is coupled to the first resistive element and has approximately twice a resistive value of the first resistive element. A capacitor is coupled to the second resistive element. A switching circuit is coupled to the capacitor. A summing integrator is coupled to each of the plurality of stages.

14 Claims, 5 Drawing Sheets

INTRODUCTION TO R2RC D/A CONVERTER

RELATED APPLICATION

This application is related to U.S. Provisional Application Ser. No. 60/720,551, filed Sep. 26, 2005, in the name of the same inventor listed above, and entitled, "AN INTRODUCTION TO R2RC D/A CONVERTER". The present patent application claims the benefit under 35 U.S.C. §119(e).

FIELD OF THE INVENTION

The invention relates to a Digital to Analog (D/A) converter, and more specifically, to a small-area, low-power, high-resolution, medium-speed D/A converter that can be realized using a precision resistor process to exceed 16 bits accuracy.

BACKGROUND OF THE INVENTION

The heart of the classic D/A converter design is a resistor network configuration known as an R2R ladder. Precision resistor processes are capable of sufficient tolerance to exceed 16 bits accuracy (i.e. 0.00076%). However, in the process of completing the DAC design by adding the digital switches (typically FETS), accuracy is lost and limited. Practical circuit implementations of the D/A converter utilizing R2R ladders are 1) scaling the switch sizes in a binary-weighted fashion and 2) decoding the MSBs into segments of resistor value R. Even with these techniques, the best D/A converters still only achieve 12 to 13 bits linearity accuracy.

There are other D/A converters that have a resistor ladder configuration which greatly reduces the switch's ill effect and increases the accuracy of the D/A converter. These circuits reduce the effect of the ON resistance of the FETs by enlarging the serial resistance. However, its speed is deteriorated as the serial resistance gets larger. Thus, there is always a trade-off between the speed and accuracy with these types of D/A converters.

Therefore, a need exists to provide a circuit and method to overcome the above problem. The circuit will be a small-area D/A converter that is low-power, has a high-resolution, and medium-speed that can be realized using a precision resistor process to exceed 16 bits accuracy.

SUMMARY OF THE INVENTION

In accordance with one embodiment of the present invention, a Digital to Analog (D/A) converter is disclosed. The D/A converter have a plurality of stages. Each of the plurality of stages has a first resistive element. A second resistive element is coupled to the first resistive element and has approximately twice a resistive value of the first resistive element. A capacitor is coupled to the second resistive element. A switching circuit is coupled to the capacitor. A summing integrator is coupled to each of the plurality of stages.

In accordance with another embodiment of the present invention, a Digital to Analog (D/A) converter is disclosed. The D/A converter have a plurality of stages. Each of the plurality of stages has a first resistive element. A second resistive element is coupled to the first resistive element and has approximately twice a resistive value of the first resistive element. A capacitor is coupled in parallel to the second resistive element. A switching circuit is coupled to the capacitor. A summing integrator is coupled to each of the plurality of stages for summing the charges transmitted from each of the plurality of stages.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, as well as a preferred mode of use, and advantages thereof, will best be understood by reference to the following detailed description of illustrated embodiments when read in conjunction with the accompanying drawings, wherein like reference numerals and symbols represent like elements.

DESCRIPTION OF PREFFERED EMBODIMENT

Figure 1:
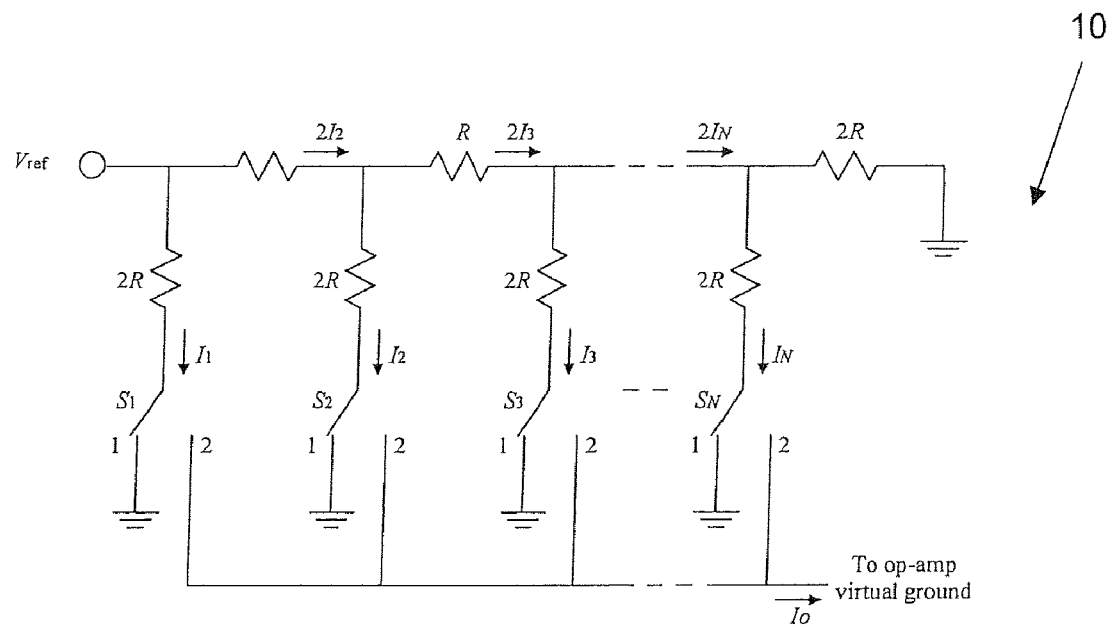
FIG. 1 is a simplified prior art circuit diagram of a D/A converter utilizing an R-2R ladder network.

Referring to FIG. 1, a prior art configuration of a D/A converter 10 is shown. The heart of the D/A converter 10 is a resistor network configuration known as an R2R ladder. Each stage of the D/A converter 10 is comprised of a pair of resistive elements R and 2R and a switching element S.

Figure 2:
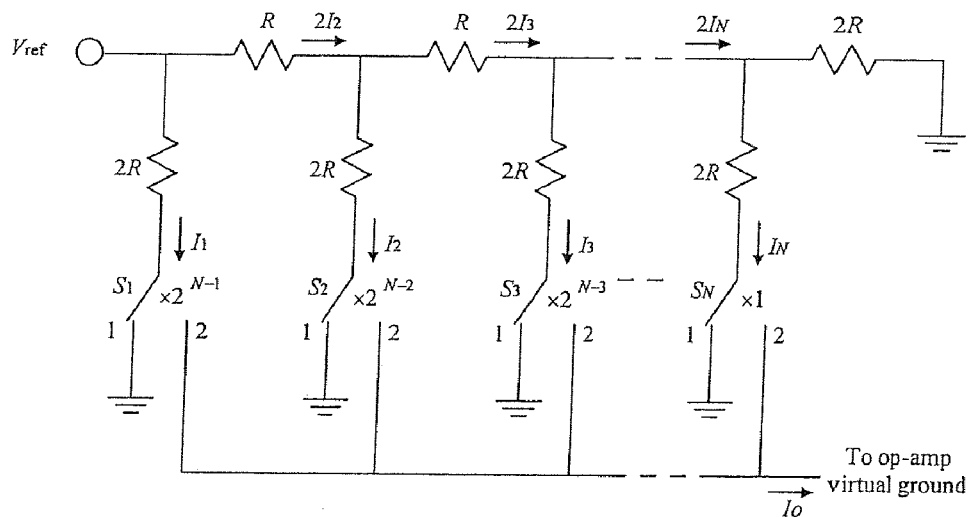
FIG. 2 is a practical prior art circuit implementation of a D/A converter utilizing an R-2R ladder network.
Figure 3:
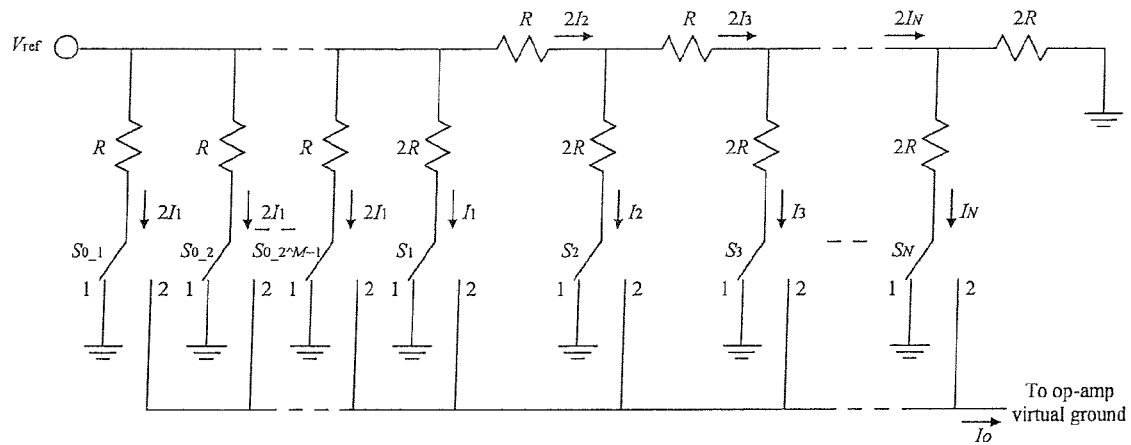
FIG. 3 is a practical prior art circuit implementation of an M+N bit D/A converter utilizing an R-2R ladder network for N-LSBs, the M-MSBs are decoded into $2^M-1$ segments of resistor value R.

Precision resistor processes are capable of sufficient tolerance to exceed 16 bits accuracy (i.e. 0.00076%). However, in the process of completing the D/A converter design by adding the digital switches (typically FETs), accuracy is lost and limited. Practical circuit implementations of the D/A converter utilizing R2R ladders are 1) scaling the switch sizes in a binary-weighted fashion as shown in FIG. 2 and 2) decoding the MSBs into segments of resistor value R as shown in FIG. 3. Even with these techniques, the best D/A converters still only achieve 12 to 13 bits linearity accuracy.

Figure 4:
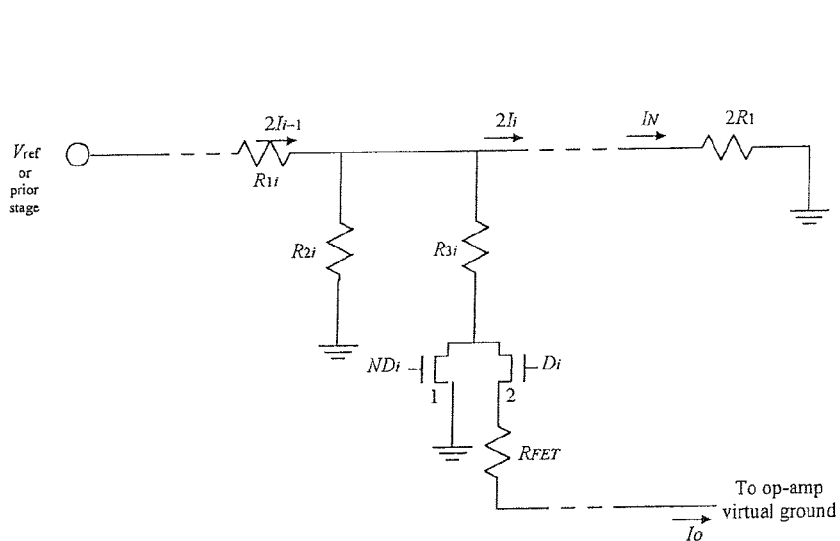
FIG. 4 is a practical prior art circuit implementation of a D/A converter utilizing a ladder configuration comprising of a series of R1-R2-R3 stages.

One resistor ladder configuration D/A converter 20 which greatly reduces the ill effect of adding digital switches and thereby increase the accuracy of the D/A converter is shown in FIG. 4. In this prior art circuit, the "2R" resistor on each successive "rung" is broken into two resistors that are effectively in parallel, i.e. R2//R3=2R. R3 is about ten times R2. The R2 resistor is tied directly to ground, while R3 is directed to either the summing junction or to ground through the FET switch. The advantage now is that the effect of the FET's mismatch and on-resistance diminishes.

A problem with the D/A converter 20 is that the resistance of the resistor R3 cannot be made excessively large because of the adverse effect on the speed of the D/A converter 20. However, at the opposite end, if the resistance is to approach 2R and resistor R2 is to become very large in resistance, the entire circuit would reduce to a conventional R-2R configuration and no improvement in accuracy would be realized.

Figure 5:
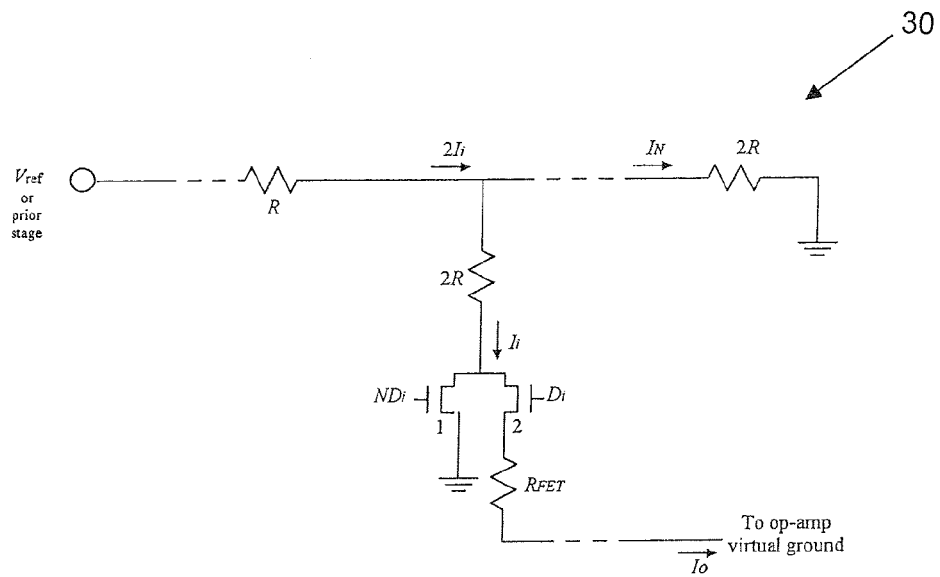
FIG. 5 is one stage of N stages of a D/A converter is illustrated utilizing the R/2R configuration of the prior art.

Referring to FIG. 5, one stage 30 of N stages of a D/A converter is illustrated utilizing the R/2R configuration of the prior art. It is well understood that with switching circuits of R/2R types as illustrated in FIG. 5, the ON resistance of the FET in each of the stages must be closely controlled in order to maintain linearity over a range of temperatures. The ON resistance for the FET in the R/2R configuration must be twice that of the ON resistance of the FET in a preceding stage. Thus a 14 bit digital-to-analog converter would require FET geometry variation between the most significant bit FET and the least significant bit FET of $2^{13}$, or 1 to 8192. For this reason, converters built utilizing the R/2R configuration with the Herman Schmid modification for FETs as shown in FIG. 2 typically cannot achieve 14 bits as the ON resistance and size of the last FETs in the ladder become too great.

The D/A converter decoding the MSBs into segments of resistor value R as shown in FIG. 3 consist of a precision R-2R ladder for the LSBs. The MSBs are decoded into segments of resistor value R. Each of these segments and the R-2R ladder is generally in the range of 8-11 bits, the number of segments for the remaining MSBs becomes large for a digital-to-analog converter above 14 bits.

Referring back to FIG. 4, the resistances relationships of the D/A converter 30 are illustrated by the circuitry for a single state which is identical for each of the stages of the D/A converter. The relationship between resistances is such that 2×R1=R2//R3. Further, the resistance of R3 is on the order of 3 to 40 times greater than the resistance of R2.

Although this circuit reduces the effect of the ON resistance of the FETs by enlarging the serial resistance R3, its speed is also deteriorated as R3 is getting large. This means there is always a trade-off between the speed and accuracy with this converter.

Figure 6:
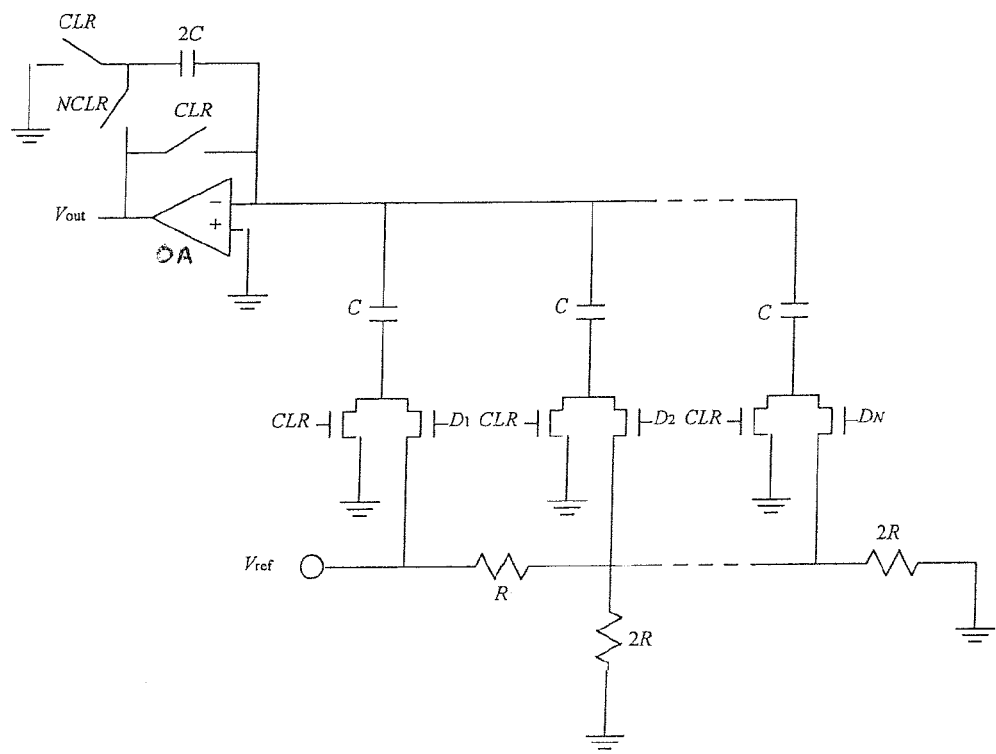
FIG. 6 is a simplified electrical schematic of a D/A converter of the present invention.
Figure 7:
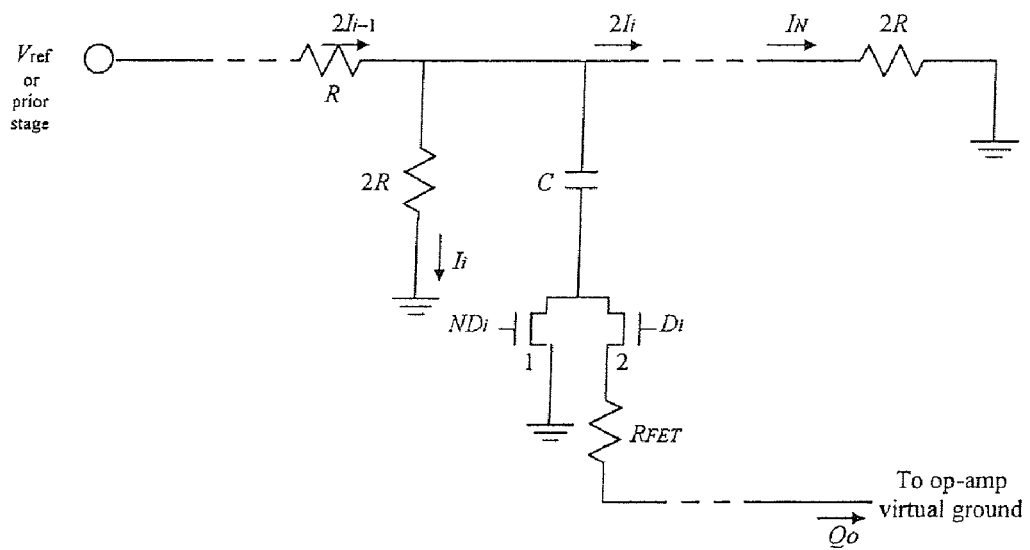
FIG. 7 is a simplified electrical schematic of one stage of the D/A converter of the present invention.

Referring to FIGS. 6 and 7, a D/A converter 100 of the present invention is shown. Good results with respect to both the converter speed and accuracy are achieved when the resistor R3 of the prior art is replaced by a capacitor C and the output is connected to a summing junction of a summing integrator for summing the charges transmitted from each stage.

As a capacitor virtually has an infinite resistance, the effect of the ON resistance of the FETs is totally eliminated. On the other hand, the speed of the converter can arbitrarily set by choosing the R and C values which are independent of the accuracy of the converter.

The FET switches of each of the stages inject the charge of the "ON" bits into the summing junction of an inverting integrator. Each bit acts independently of one another, and the resolution does not depend on the MOS switch on-resistance at all. As R3 is replaced by C and charge instead of current is transmitted, there is no trade-off between resolution and speed. Moreover, component spread is small so silicon area can be much smaller. It can be shown that the circuit is offset-compensated and there is a transmission zero at 0 Hz so that 1/f noise is largely reduced in the design.

The SC gain amplifier formed by the capacitor C of each stage and the summing integrator has many desirable features that are especially important in this application. Perhaps most important, the 1/f output noise of the amplifier is reduced by an effective transmission zero at dc. This also minimizes any dc offsets of the amplifier due to op-amp finite input offset voltages.

In accordance with one embodiment of the present invention, the unit capacitor size C was chosen to be 1 pF. Thus, the total capacitance of the D/A converter 100 was 16 pF. The unit resistor size R was 7.5 kOhm and the total resistance of the sichrome resistor ladder was nominally 285 kOhm.

Figure 8:
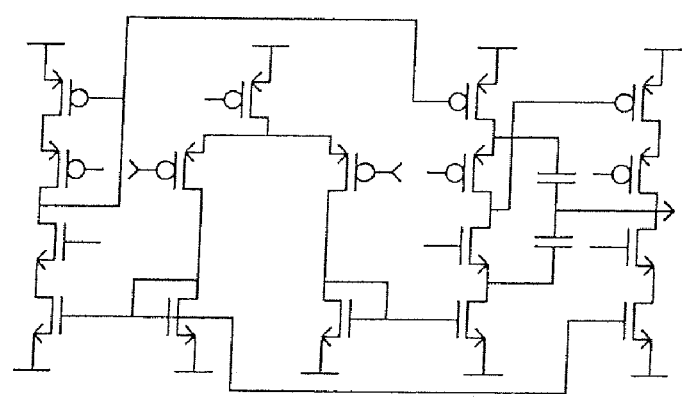
FIG. 8 is a simplified electrical schematic of a two-stage op amp used in the D/A converter of the present invention.

One embodiment of the op amp OA used in the D/A converter 100 is shown in FIG. 8. It is a standard, single-output, two-stage op amp with the cascode symmetrical OTA as the input stage.

Figure 9:
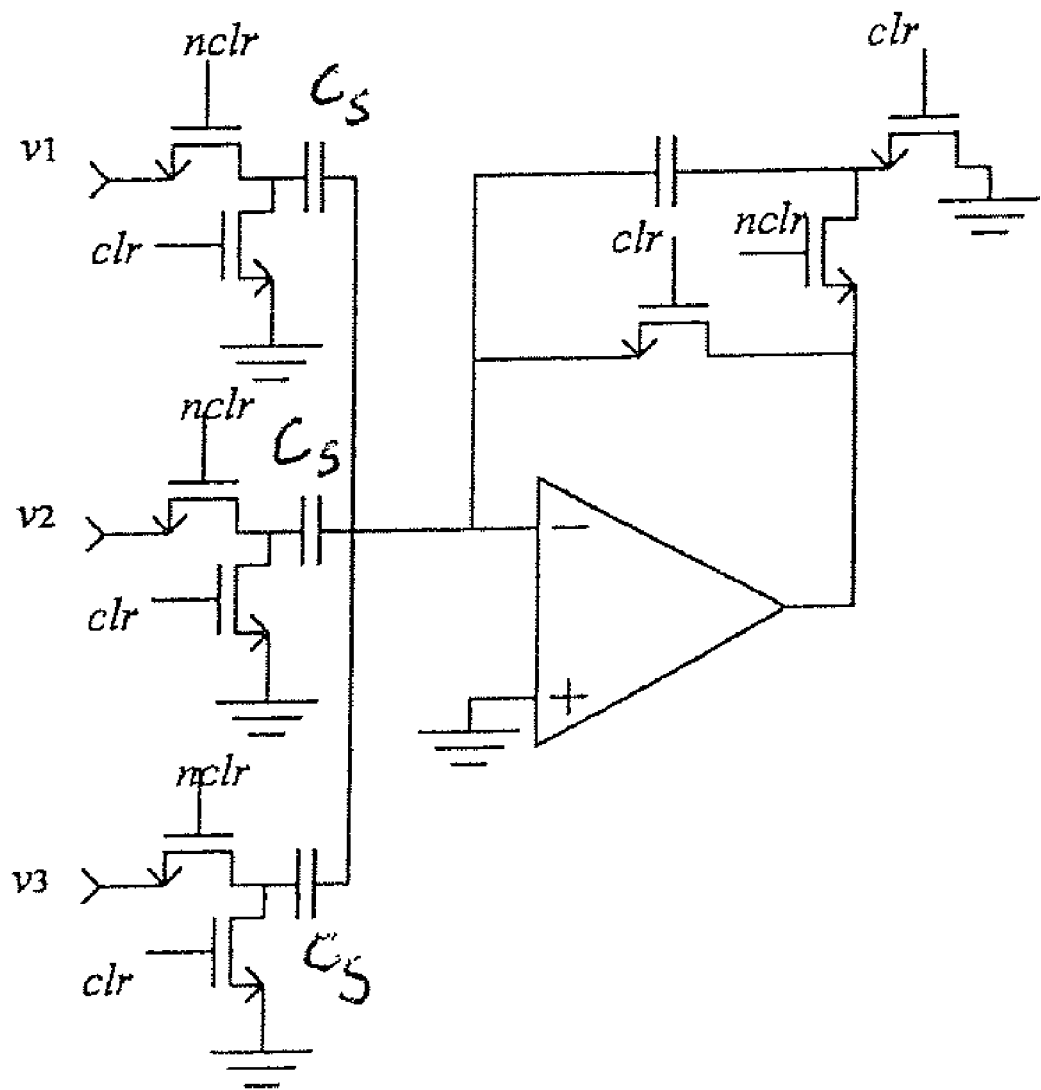
FIG. 9 is a simplified electrical schematic of a switched capacitor summing integrator used in the D/A converter of the present invention.

One embodiment of the switched-capacitor integrator circuit with rest 110 that combines input signals is shown in FIG. 9. The switched-capacitors $C_s$ are arranged in a way that the integrator just integrates the input signal but not the offset voltage of the op-amp OA. In the present embodiment, reset switches $SW_r$ are placed around the feedback capacitor and they also help eliminate the output offset of the D/A converter in each conversion cycle.

The major limitations on the speed of D/A converters are the settling time of the op amp and the settling time of the RC time constant associated with the resistor ladder, the switches and the capacitor array. In accordance with one embodiment of the present invention, the load capacitance of the op amp was estimated to be 30 pF. With this load the op amp OA had an estimated slew rate of 0.67 V/us and a 2 MHz unity gain bandwidth. The slewing time required for the op amp OA was estimated to be 3.7 us, whereas the small-signal settling time was estimated to have an 80 ns time constant. The resistor-capacitor time constant is dominated by the two 7.5 kOhm in series and the 1 pF input capacitor. The total time constant was estimated to be 15 ns. The first-order approximation implies that 0.9 us is required for the small-signal settling to 14-bit accuracy. When the time for slewing is added, then 4.6 us is required for settling each half period and the maximum clock rate is estimated to be 109 kHz.

There are four major unavoidable noise sources in the D/A converter. They are the thermal noise of the 14-bit R2R string, switches and op amp and the 1/f noise of the op amp. After integrating the power spectral density of the simulation result, the total noise is 8.78 uV.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A Digital to Analog (D/A) converter comprising:
   a plurality of stages wherein each of the plurality of stages comprises:
   a first resistive element;
   a second resistive element coupled to the first resistive element and having approximately twice a resistive value of the first resistive element;
   a capacitor coupled to the second resistive element; and
   a switching circuit coupled to the capacitor; and
   a summing integrator coupled to each of the plurality of stages.

2. A Digital to Analog (D/A) converter in accordance with claim 1 wherein the capacitor is coupled in parallel to the second resistive element.

3. A Digital to Analog (D/A) converter in accordance with claim 1 wherein the capacitor reduces a resistive effect of the switching circuit.

4. A Digital to Analog (D/A) converter in accordance with claim 1 wherein the summing integrator comprises:
   an operational amplifier having a first input coupled to the plurality of stages, a second input coupled to ground potential, and an output;
   a feedback capacitor coupled to the output of the operational amplifier and the first input of the operational amplifier; and
   a summing integrator switching circuit coupled to the operational amplifier and the feedback capacitor.

5. A Digital to Analog (D/A) converter in accordance with claim 4 wherein the operational amplifier is a two stage operational amplifier having a cascode symmetrical OTA input stage.

6. A Digital to Analog (D/A) converter in accordance with claim 1 wherein the summing integrator sums the charges transmitted from each of the plurality of stages.

7. A Digital to Analog (D/A) converter comprising:
   a plurality of stages wherein each of the plurality of stages comprises:
      a first resistive element;
      a second resistive element coupled to the first resistive element and having approximately twice a resistive value of the first resistive element;
      a capacitor coupled in parallel to the second resistive element; and
      a switching circuit coupled to the capacitor; and
   a summing integrator coupled to each of the plurality of stages for summing the charges transmitted from each of the plurality of stages.

8. A Digital to Analog (D/A) converter in accordance with claim 7 wherein the capacitor reduces a resistive effect of the switching circuit.

9. A Digital to Analog (D/A) converter in accordance with claim 7 wherein the summing integrator comprises:
   an operational amplifier having a first input coupled to the plurality of stages, a second input coupled to ground potential, and an output;
   a feedback capacitor coupled to the output of the operational amplifier and the first input of the operational amplifier; and
   a summing integrator switching circuit coupled to the operational amplifier and the feedback capacitor.

10. A Digital to Analog (D/A) converter in accordance with claim 9 wherein the operational amplifier is a two stage operational amplifier having a cascode symmetrical OTA input stage.

11. A Digital to Analog (D/A) converter comprising:
   a plurality of stages wherein each of the plurality of stages comprises:
      a first resistive element;
      a second resistive element coupled to the first resistive element and having approximately twice a resistive value of the first resistive element;
      a capacitor coupled in parallel to the second resistive element; and
      a switching circuit coupled to the capacitor; and
   a summing integrator coupled to each of the plurality of stages;
   wherein the capacitor reduces a resistive effect of the switching circuit.

12. A Digital to Analog (D/A) converter in accordance with claim 11 wherein the summing integrator comprises:
   an operational amplifier having a first input coupled to the plurality of stages, a second input coupled to ground potential, and an output;
   a feedback capacitor coupled to the output of the operational amplifier and the first input of the operational amplifier; and
   a summing integrator switching circuit coupled to the operational amplifier and the feedback capacitor.

13. A Digital to Analog (D/A) converter in accordance with claim 12 wherein the operational amplifier is a two stage operational amplifier having a cascode symmetrical OTA input stage.

14. A Digital to Analog (D/A) converter in accordance with claim 11 wherein the summing integrator sums the charges transmitted from each of the plurality of stages.

* * * * *